(12) United States Patent
Chen et al.

(10) Patent No.: US 7,651,824 B1
(45) Date of Patent: Jan. 26, 2010

(54) METHOD FOR COMPENSATING CRITICAL DIMENSION VARIATIONS IN PHOTOMASKS

(75) Inventors: Hsuan-Ko Chen, Taipei County (TW);
Mei-Li Wang, Changhua County (TW);
Chih-Cheng Chin, Taipei County (TW);
Pei-Cheng Fan, Taoyuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 12/329,628

(22) Filed: Dec. 7, 2008

(30) Foreign Application Priority Data

Aug. 29, 2008 (TW) .............................. 97133206 A

(51) Int. Cl.
*G03F 9/00* (2006.01)
(52) U.S. Cl. ............................................. 430/5; 430/30
(58) Field of Classification Search ...................... 430/5, 430/30
See application file for complete search history.

(56) References Cited

U.S. PATENT DOCUMENTS

| 6,911,286 | B2 * | 6/2005 | Kang et al. ..................... 430/5 |
| 7,001,697 | B2 * | 2/2006 | Park et al. ...................... 430/5 |
| 2007/0042276 | A1 * | 2/2007 | Bae ............................... 430/5 |
| 2007/0065729 | A1 | 3/2007 | Zait et al. |
| 2007/0196744 | A1 | 8/2007 | Hennig et al. |

* cited by examiner

*Primary Examiner*—Christopher G Young
(74) *Attorney, Agent, or Firm*—Winston Hsu

(57) ABSTRACT

A method for compensating critical dimension (CD) variations of patterns of a substrate, by the correcting the CD of the corresponding photomask is disclosed. First, a light and a main photomask are provided. Second, an auxiliary photomask including an auxiliary transparent substrate and a shading element within the auxiliary transparent substrate is provided. Next the light passes through the auxiliary photomask and main photomask in order for compensating CD variations of patterns corresponding to main photomask.

7 Claims, 2 Drawing Sheets

METHOD FOR COMPENSATING CRITICAL DIMENSION VARIATIONS IN PHOTOMASKS

BACKGROUND OF THE INVENTION

1. Field of the Invention

The present invention relates to a method for compensating critical dimension variations of patterns in photomasks. In particular, the present invention relates to a method for correcting the resultant critical dimension of a corresponding photomask in a given exposure procedure.

2. Description of the Prior Art

In integrated circuit manufacturing processes, a lithographic process is a mandatory technique. Accordingly, exposure techniques play an essential role in the semiconductor industry because advanced exposure techniques make the pre-determined patterns on the reticles easily and precisely transferred onto a substrate. In a lithographic process, a designed pattern, such as a circuit pattern or a contact hole pattern is created on one or several photomasks. The pattern on the photomask is then transferred by light exposure, using a stepper and scanner, into a photoresist layer on a semiconductor wafer. Only by using a lithographic process can a wafer producer precisely and clearly transfer a complicated circuit pattern onto a semiconductor wafer. It is an important issue to enhance the resolution of the lithographic process due to the reduced device sizes utilized in the modern semiconductor industry.

The specification of the exposure system determines the critical dimension of the pattern feature. Theoretically speaking, short wavelengths of light are desirable, as using shorter wavelengths of light to expose a photoresist layer will proportionally improve the resolution. The current IC processes require sub-micron resolution. Such sub-micron processes require that critical dimensions (CD) of the features be correctly and uniformly transferred onto the wafer with strict specifications.

In the current exposure system, the light source itself is the most basic factor that determines the critical dimension of the pattern feature. The shorter the wavelength of the light source is, usually the shorter the critical dimension of the pattern feature will be. With the trend of miniaturization of dynamic random access memory (DRAM), it is a key issue to enhance the critical dimension uniformity (CDU). For this reason, the critical dimension correction (CDC) has been proposed to solve the problems.

U.S. patent publication 2007/0065729 A1 proposes a method for compensating for critical dimension (CD) variations of pattern lines of a wafer, by the correcting the CD of the corresponding photomask. Ultrafast laser is employed to change the material property within the substrate of the product photomask in regions which correlate to regions of the wafer exposure field to result in the change in index of refraction, whereby attenuating light passing through the regions, so as to compensate critical dimension error for the CD variations on the wafer and hence provide an improved CD tolerance wafer.

However, such solution substantially changes the material property within the substrate and destroys the substrate of the product photomask. It is an irreversible process with some possible drawbacks and risks. First, once the product photomask is incorrectly changed, the only way to fix the problem is to replace the broken one with another new product photomask at an extra cost for the expensive new photomask and the delay of the production. Second, the change of the material property within the substrate of the product photomask in regions which correlates to regions of the wafer exposure field to result in the change in index of refraction may merely solve the problem of a specific instrument but can not generally solve the problem that different exposure instruments performs differently.

In the light of the aforesaid flawed solution to compensate critical dimension variations of patterns in photomasks, therefore, a novel technique is needed to provide a general, trans-instrument solution.

SUMMARY OF THE INVENTION

The present invention accordingly proposes a novel solution to compensate critical dimension variations of patterns in photomasks by a general, trans-instrument solution. The method of the present invention not only is capable of selectively compensating critical dimension variations of patterns in photomasks but also is compatible with different exposure instruments.

The present invention accordingly proposes a method for compensating critical dimension (CD) variations of patterns of a substrate, by the correcting the CD of the corresponding photomask. First, a light source and a main photomask are provided. Second, an auxiliary photomask arranged with the main photomask in order is provided. The auxiliary photomask includes an auxiliary transparent substrate and a shading element within the auxiliary transparent substrate. Next the light from the light source passes through the auxiliary photomask and the main photomask in order. The shading element compensates the critical dimension (CD) variations corresponding to the main photomask by shading a region through which the light passes.

In the method for compensating critical dimension (CD) variations of patterns of a photomask of the present invention, the shading element is provided within the auxiliary transparent substrate for correcting the critical dimension of the corresponding photomask when the main pattern is formed by an exposure procedure or obtaining a specific result when the light passes through the main photomask. Accordingly, the critical dimension (CD) variations of the layout pattern are properly compensated and the problem of uneven exposure energy output of different exposure instruments is solved. In addition, the shading element is disposed within the auxiliary transparent substrate rather than the main photomask. Accordingly, different auxiliary transparent substrates of different shading elements corresponding to different exposure instruments are separately produced to be universally compatible. Even the auxiliary transparent substrate is incorrectly produced or destroyed, the main photomask is not damaged at all without jeopardizing the production flow.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
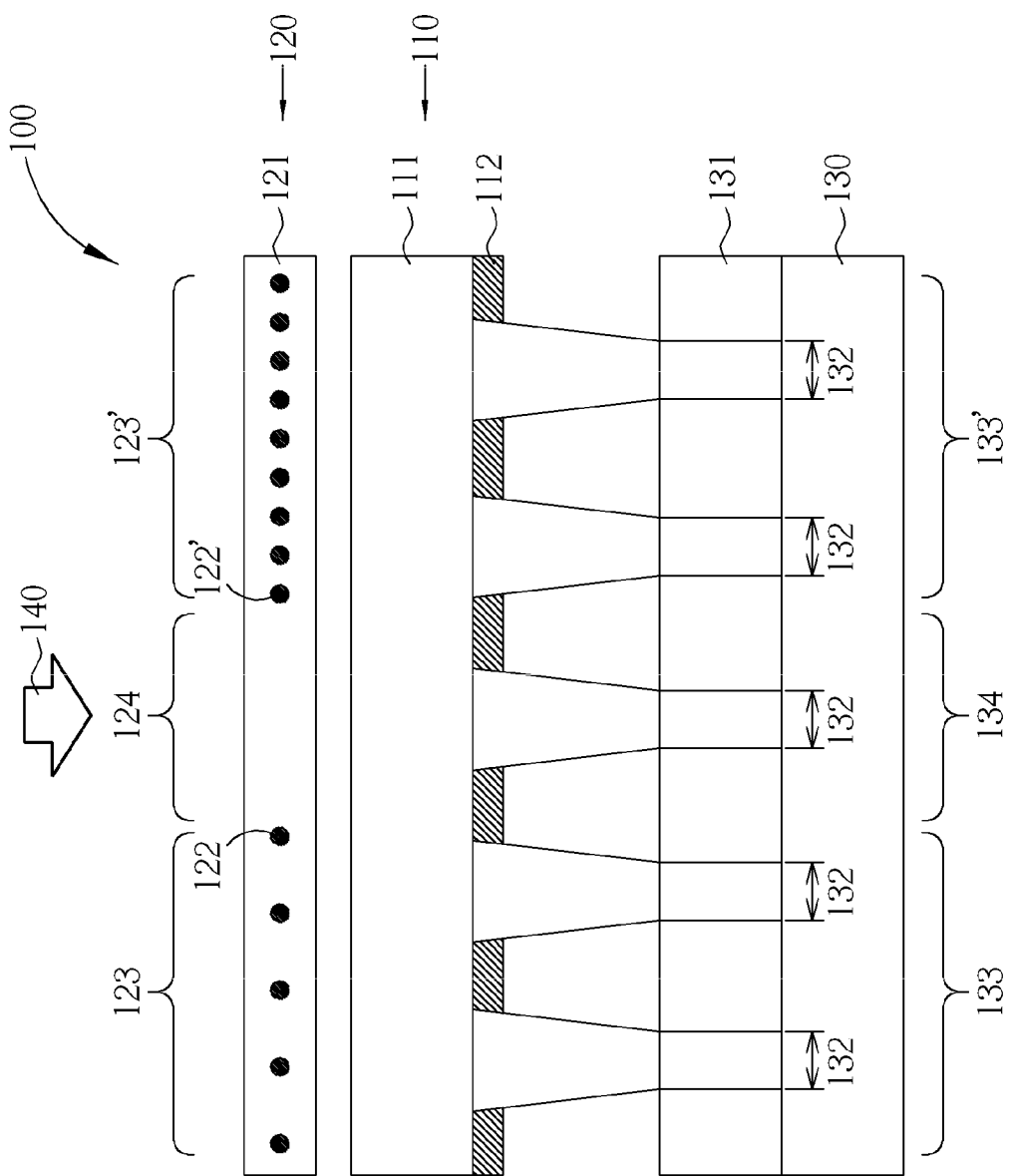
FIG. 1 illustrates an example of the exposure assembly of the present invention.

The present invention first provides an exposure assembly. FIG. 1 illustrates an example of the exposure assembly of the present invention. The exposure assembly 100 of the present invention includes a main photomask 110 and an auxiliary photomask 120. The main photomask 110 includes a main transparent substrate 111 and a main pattern 112. The main photomask 110 is useful to define an element layout pattern on the substrate 130. Generally speaking, the main photomask 110 is also called a "product photomask." The main transparent substrate 111 is usually a glass substrate and the glass substrate is substantially transparent to the exposure light source. In general, the glass substrate is made of quartz. The main pattern 112 is on one side of the main transparent substrate 111 to block the exposure light and to form the predetermined pattern on the photoresist. Because the main pattern 112 should be susceptible to etching and patterning, the main pattern 112 is usually made of patterned metal, such as Cr, or other suitable metals.

The auxiliary photomask 120 includes an auxiliary transparent substrate 121 and shading elements 122/122'. The auxiliary transparent substrate 121 is usually a glass substrate and the glass substrate is substantially transparent to the exposure light source. In general, the glass substrate is made of quartz. The shading elements 122/122' are opaque and disposed within the auxiliary transparent substrate 121. Generally, a destructive energy source, such as laser, is employed to change the partial material property of auxiliary transparent substrate 121, for example to destroy part of the regions in the auxiliary transparent substrate 121, to shade the regions through which the exposure light passes and to further change the transmission of the exposure light. The shading elements 122/122' are so located in order to correspond to the main pattern 112 so as to compensate critical dimension variations of main pattern 112 by correcting the defects of the layout patterns and/or to solve the uneven exposure energy output of a specific exposure instrument.

As shown in FIG. 1, the shading element 122/122' may be single or a plurality of continuous shading units, or in single layer or in multiple layers. They may form groups of different density, like weak shading elements 122 or strong shading elements 122', which respectively belong to a sparse group 123 or a dense group 123'. There are also some regions containing no shading element 122/122' in the auxiliary transparent substrate 121, namely the blank regions 124.

The density, namely a second density, of the strong shading elements 122' is relatively higher than that, namely a first density, of the weak shading elements 122, so the weak shading elements 122 relatively shade less light than the strong shading elements 122'. However, there is no shading element 122 or 122' in the blank regions 124, so the blank regions 124 have no substantial influence on the exposure light. Accordingly, the sparse group 123, the dense group 123' and the blank regions 124 may be optionally arranged to shade the regions through which the light passes and change the transmission of the exposure light to adjust the critical dimension of the element layout pattern on the entire wafer 130 and/or to solve the uneven exposure energy output of a specific exposure instrument.

Given the above, there are a first critical dimension group 133, a second critical dimension group 133' and a third critical dimension group 134 formed respectively by the sparse group 123, the dense group 123' and the blank regions 124 on the wafer 130. The individual sizes of the first critical dimension group 133, the second critical dimension group 133' and the third critical dimension group 134 may be the same or different.

Figure 2:
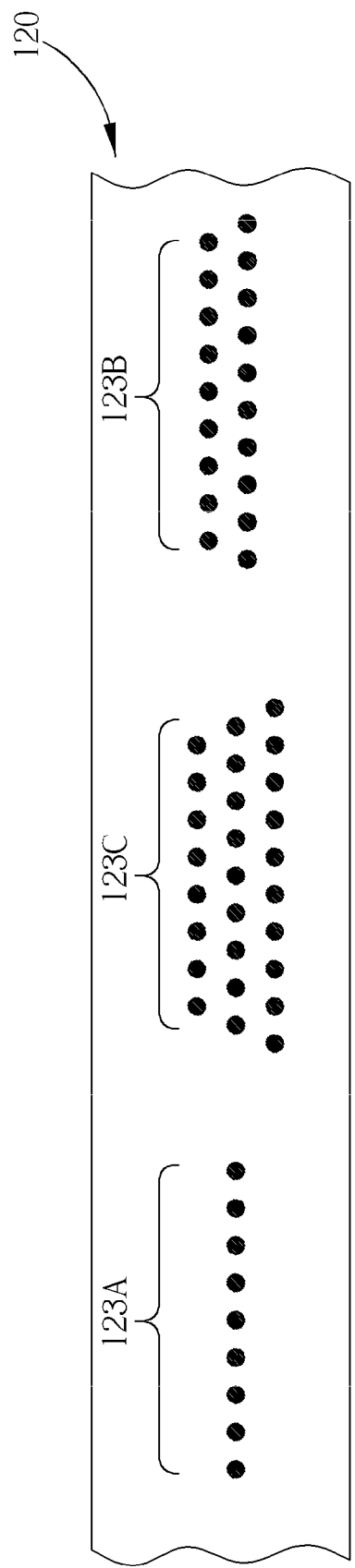
FIG. 2 illustrates the shading elements are in the form of single layer and in the form of multi-layer.

Optionally, the shading elements 122/122' of the present invention may be in the form of single layer or multi-layer. FIG. 1 illustrates the shading elements are in the form of single layer, and FIG. 2 illustrates the shading elements in the auxiliary photomask 120 are in the form of single layer 123A and in the form of multi-layers 123B/123C in accordance with different processes to facilitate different shading elements to correct the main pattern 112.

It is pretty easy to use the exposure assembly 100 of the present invention. A method for compensating critical dimension (CD) 132 by exposure of layout patterns on a substrate 130 is provided, by correcting the critical dimension of a corresponding photomask. As shown in FIG. 1, first a main photomask 110 is provided to define a layout pattern on the substrate 130. Second, an auxiliary photomask 120 is provided. The auxiliary photomask 120 includes an auxiliary transparent substrate 121 and shading elements 122/122' within the auxiliary transparent substrate 121. The shading elements 122/122' are so located to correspond to the main pattern 112 on the main photomask 110.

Then, a light source 140 with a proper wavelength is provided as the exposure light. The light 140 passes through the auxiliary photomask 120 and the main photomask 110 in order for defining an element layout pattern (not shown) on the substrate 130, and simultaneously renders the element layout pattern (not shown) to have a pre-determined critical dimension 132 or to form a first critical dimension group 133, a second critical dimension group 133' and a third critical dimension group 134. There are different shading elements 122/122' corresponding to different layout patterns. For example, a first element layout pattern (not shown) corresponds to the weak shading elements 122 and a second element layout pattern (not shown) corresponds to the strong shading elements 122'. The individual sizes of the first critical dimension group 133, the second critical dimension group 133' and the third critical dimension group 134 may be the same or different.

Because the light 140 passes through the pre-determined shading elements 122/122' which shade the regions the light 140 passes through, the needed critical dimension 132 in the process is formed in the photoresist 131 to correct the critical dimension (CD) variations of layout patterns during exposure procedure. Or alternatively, the shading elements 122/122' are so arranged to give a specific result. For example, the element layout patterns of different critical dimensions are therefore formed on the photoresist 131 to look forward to a critical dimension 132 which meets the demand of the process after etching procedure.

In addition, if the original auxiliary photomask 120 is not useful because the main photomask 110 is used in another exposure instrument, a new auxiliary photomask may be made in advance to match the energy distribution of the new exposure instrument. Accordingly, the use of the exposure assembly 100 of the present invention in addition solves the problem of different energy distribution of different exposure instrument.

In the exposure assembly of the present invention, the shading elements are provided to shade the regions through which a light passes in order to compensate the defects of the element layout pattern when the main pattern is formed by an exposure procedure, or to give a specific result. Accordingly, the critical dimension (CD) variations of the layout pattern are properly compensated and the problem of uneven exposure energy output of different exposure instruments is solved. In addition, the shading element is disposed within the auxiliary transparent substrate rather than the main photomask. Accordingly, different auxiliary transparent substrates of different shading elements corresponding to different exposure instruments are separately produced to be universally compatible. Even the auxiliary transparent substrate is incorrectly produced or destroyed, the main photomask is not damaged at all without jeopardizing the production flow.

Those skilled in the art will readily observe that numerous modifications and alterations of the device and method may be made while retaining the teachings of the invention.

What is claimed is:

1. A method for compensating critical dimension (CD) variations of patterns of a substrate, comprising:
    providing a light source and a main photomask; and
    providing an auxiliary photomask arranged in order with said main photomask and comprising an auxiliary transparent substrate and an opaque shading element disposed within said auxiliary transparent substrate, thereby compensating said critical dimension (CD) variations of a layout pattern of said substrate after light from said light source passes through said auxiliary photomask and said main photomask in order, wherein said shading element compensates said critical dimension (CD) variations corresponding to said layout pattern by shading a region through which said light passes.

2. The method for compensating critical dimension variations of patterns of a substrate of claim 1, wherein said shading element comprises a plurality of continuous shading units.

3. The method for compensating critical dimension variations of patterns of a substrate of claim 1, wherein said shading element comprises at least a first shading element of a first density and a second shading element of a second density unique to that of the first density.

4. The method for compensating critical dimension variations of patterns of a substrate of claim 2, wherein said shading element comprises at least a first shading element of a first density and a second shading element of a second density unique to that of the first density.

5. The method for compensating critical dimension variations of patterns of a substrate of claim 2, wherein said first density is larger than that of the second density.

6. The method for compensating critical dimension variations of patterns of a substrate of claim 3, wherein said first density is larger than that of the second density.

7. The method for compensating critical dimension variations of patterns of a substrate of claim 4, wherein said first density is larger than that of the second density.

* * * * *